(12) United States Patent
Baluja et al.

(10) Patent No.: US 11,017,986 B2
(45) Date of Patent: May 25, 2021

(54) DEPOSITION RADIAL AND EDGE PROFILE TUNABILITY THROUGH INDEPENDENT CONTROL OF TEOS FLOW

(71) Applicant: Applied Materials, Inc., Santa Clara, CA (US)

(72) Inventors: Sanjeev Baluja, Campbell, CA (US); Yi Yang, San Jose, CA (US); Truong Nguyen, Milpitas, CA (US); Nattaworn Boss Nunta, Stanford, CA (US); Joseph F. Aubuchon, San Jose, CA (US); Tuan Anh Nguyen, San Jose, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 169 days.

(21) Appl. No.: 16/001,264

(22) Filed: Jun. 6, 2018

(65) Prior Publication Data
US 2018/0350562 A1 Dec. 6, 2018

Related U.S. Application Data

(60) Provisional application No. 62/516,050, filed on Jun. 6, 2017.

(51) Int. Cl.
*H01J 37/32* (2006.01)
*C23C 16/455* (2006.01)
(Continued)

(52) U.S. Cl.
CPC ...... *H01J 37/32449* (2013.01); *C23C 16/401* (2013.01); *C23C 16/4401* (2013.01);
(Continued)

(58) Field of Classification Search
CPC .............. C23C 16/45563–45565; H01J 37/3244–32449
See application file for complete search history.

(56) References Cited

U.S. PATENT DOCUMENTS

| 6,245,192 B1 * | 6/2001 | Dhindsa | C23C 16/45572 156/345.34 |
| 2010/0119727 A1 * | 5/2010 | Takagi | C23C 16/45574 118/723 MP |

(Continued)

*Primary Examiner* — Binu Thomas
(74) *Attorney, Agent, or Firm* — Patterson + Sheridan, LLP

(57) ABSTRACT

Disclosed embodiments generally relate to a processing chamber that includes a perforated lid, a gas blocker disposed on the perforated lid, and a substrate support disposed below the perforated lid. The gas blocker includes a gas manifold, a central gas channel formed in the gas manifold, a first gas distribution plate that includes inner and outer trenches surrounding the central gas channel, and a first and second gas channels formed in the gas manifold. The first gas channel is in fluid communication with a first gas source and the inner trench, and the second gas channel is in fluid communication with the first gas source and the outer trench and a second gas distribution plate The first gas channel is in further fluid communication with a third gas distribution plate that is disposed below the second gas distribution plate, and a plurality of pass-through channels that are disposed between the second gas distribution plate and the third gas distribution plate. The second gas distribution plate includes a plurality of through holes formed through a bottom of the second gas distribution plate as well as a central opening in fluid communication with the central gas channel The second gas distribution plate further includes a recess region formed in a top surface of the second gas distribution plate, and the recess region surrounds the central opening.

17 Claims, 3 Drawing Sheets

(51) Int. Cl.
  *C23C 16/40* (2006.01)
  *C23C 16/50* (2006.01)
  *C23C 16/52* (2006.01)
  *C23C 16/44* (2006.01)
  *C23C 16/509* (2006.01)

(52) U.S. Cl.
  CPC .... *C23C 16/4557* (2013.01); *C23C 16/45512* (2013.01); *C23C 16/45561* (2013.01); *C23C 16/45565* (2013.01); *C23C 16/50* (2013.01); *C23C 16/5096* (2013.01); *C23C 16/52* (2013.01); *H01J 37/3244* (2013.01); *H01J 37/32522* (2013.01); *C23C 16/45574* (2013.01); *H01J 2237/3321* (2013.01); *H01J 2237/3323* (2013.01)

(56) References Cited

U.S. PATENT DOCUMENTS

| | | | |
|---|---|---|---|
| 2011/0088847 A1 | 4/2011 | Law et al. | |
| 2014/0291286 A1* | 10/2014 | Okayama | C23C 16/45574 156/345.34 |
| 2015/0107772 A1* | 4/2015 | Uchida | C23C 16/45565 156/345.33 |
| 2015/0167705 A1 | 6/2015 | Lee et al. | |
| 2016/0010210 A1* | 1/2016 | Yanai | C23C 16/45574 118/704 |
| 2016/0289831 A1* | 10/2016 | Je | C23C 16/45565 |
| 2017/0101712 A1* | 4/2017 | Bansal | C23C 16/45565 |

\* cited by examiner

DEPOSITION RADIAL AND EDGE PROFILE TUNABILITY THROUGH INDEPENDENT CONTROL OF TEOS FLOW

CROSS-REFERENCE TO RELATED APPLICATIONS

This application claims priority to U.S. provisional patent application Ser. No. 62/516,050, filed Jun. 6, 2017, which is herein incorporated by reference.

BACKGROUND

Field

Embodiments of the disclosure generally relate to an improved method and apparatus for controlling deposition near an edge of the substrate.

Description of the Related Art

Plasma enhanced chemical vapor deposition (PECVD) is generally employed to deposit thin films on a substrate such as a flat panel or semiconductor wafer. Plasma enhanced chemical vapor deposition is generally accomplished by introducing a precursor gas into a vacuum chamber that contains a substrate. The precursor gas is typically directed through a distribution plate disposed near the top of the chamber. The precursor gas in the chamber is energized (e.g., excited) to form a plasma by applying RF power to the chamber from one or more RF sources coupled to the chamber. The excited gas reacts to form a layer of material on a surface of the substrate that is positioned on a temperature controlled substrate support.

It has been observed that the distribution of precursor gases in the chamber may result in varying plasma densities across the surface of the substrate, causing different deposition rates between the center and the edge of the substrate. Therefore, there is a need in the art for an improved method and apparatus with better control of gas distribution.

SUMMARY OF THE DISCLOSURE

In one embodiment, a processing chamber for processing a substrate is provided. The processing chamber includes a perforated lid, a gas blocker disposed on the perforated lid, and a substrate support disposed below the perforated lid. The gas blocker includes a gas manifold, a central gas channel formed in the gas manifold, a first gas distribution plate disposed below the gas manifold, the first gas distribution plate comprising an inner trench surrounding the central gas channel and an outer trench surrounding the inner trench, a first gas channel formed in the gas manifold, the first gas channel having a first end in fluid communication with a first gas source and a second end in fluid communication with the inner trench, a second gas channel formed in the gas manifold, the second gas channel having a first end in fluid communication with the first gas source and a second end in fluid communication with the outer trench, a second gas distribution plate disposed below the first gas distribution plate, a third gas distribution plate disposed below the second gas distribution plate, the third gas distribution plate comprising a plurality of through holes formed through a bottom of the third gas distribution plate, and the third gas distribution plate contacting a top surface of the perforated lid, and a plurality of pass-through channels disposed between the second gas distribution plate and the third gas distribution plate, and each pass-through channel being extended through the perforated lid. The second gas distribution plate includes a plurality of through holes formed through a bottom of the second gas distribution plate, a central opening in fluid communication with the central gas channel, and a recess region formed in a top surface of the second gas distribution plate, the recess region surrounds the central opening.

In another embodiment, the processing chamber includes a first gas source comprising a first gas line and a second gas line, a perforated lid, a gas blocker disposed on the perforated lid, and a substrate support disposed below the perforated lid, the substrate support having a substrate supporting surface. The gas blocker includes a gas manifold, a central gas channel formed in the gas manifold, a first gas distribution plate disposed below the gas manifold, the first gas distribution plate comprising an inner trench surrounding the central gas channel and an outer trench surrounding the inner trench, a first gas channel formed in the gas manifold, the first gas channel having a first end in fluid communication with the first gas line and a second end in fluid communication with the inner trench, a second gas channel formed in the gas manifold, the second gas channel having a first end in fluid communication with the second gas line and a second end in fluid communication with the outer trench, a second gas distribution plate disposed below the first gas distribution plate, the second gas distribution plate comprising a plurality of through holes formed through a bottom of the second gas distribution plate, a third gas distribution plate disposed below the second gas distribution plate, and the third gas distribution plate comprising a plurality of through holes formed through a bottom of the third gas distribution plate, and the third gas distribution plate contacts a top surface of the perforated lid.

In yet another embodiment, a process system for processing a substrate is provided. The process system includes a first gas source comprising a first gas line, a second gas line, a third gas line, and a fourth gas line, a second gas source comprising a fifth gas line and a sixth gas line, a first processing chamber, and a second processing chamber separated from the first processing chamber. The first processing chamber includes a perforated lid, a gas blocker disposed on the perforated lid, and a substrate support having a substrate supporting surface, the substrate supporting surface and the perforated lid define a substrate processing region therebetween. The gas blocker of the first processing chamber includes a gas manifold, a first gas distribution plate disposed below the gas manifold, the first gas distribution plate comprising an inner trench and an outer trench formed in a top surface of the first gas distribution plate, the inner trench and the outer trench are arranged in two concentric circles, a central gas channel formed through at least the gas manifold and the first gas distribution plate, the central gas channel in fluid communication with the second gas source through the fifth gas line, and the central gas channel is surrounded by the inner trench and the outer trench, a first gas channel formed through at least a portion of the gas manifold and disposed radially outward of the central gas channel, the first gas channel having a first end in fluid communication with the first gas line and a second end in fluid communication with the inner trench, and a second gas channel formed through at least a portion of the gas manifold and disposed radially outward of the first gas channel, the second gas channel having a first end in fluid communication with the second gas line and a second end in fluid communication with the outer trench. The second processing chamber includes a perforated lid, a gas blocker disposed on the perforated lid of the second processing chamber, and a substrate support having a substrate supporting surface, the substrate supporting surface and the perforated lid defining a substrate processing region therebetween. The gas blocker of the second processing chamber includes a gas manifold, a first gas distribution plate disposed below the gas manifold, the first gas distribution plate comprising an inner trench and an outer trench formed in a top surface of the first gas distribution plate, the inner trench and the outer trench are arranged in two concentric circles, a central gas channel formed through at least the gas manifold and the first gas distribution plate, the central gas channel in fluid communication with the second gas source through the sixth gas line, and the central gas channel is surrounded by the inner trench and the outer trench, a first gas channel formed through at least a portion of the gas manifold and disposed radially outward of the central gas channel, the first gas channel having a first end in fluid communication with the third gas line and a second end in fluid communication with the inner trench, and a second gas channel formed through at least a portion of the gas manifold and disposed radially outward of the first gas channel, the second gas channel having a first end in fluid communication with the fourth gas line and a second end in fluid communication with the outer trench.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the figures.

DETAILED DESCRIPTION

Figure 1:
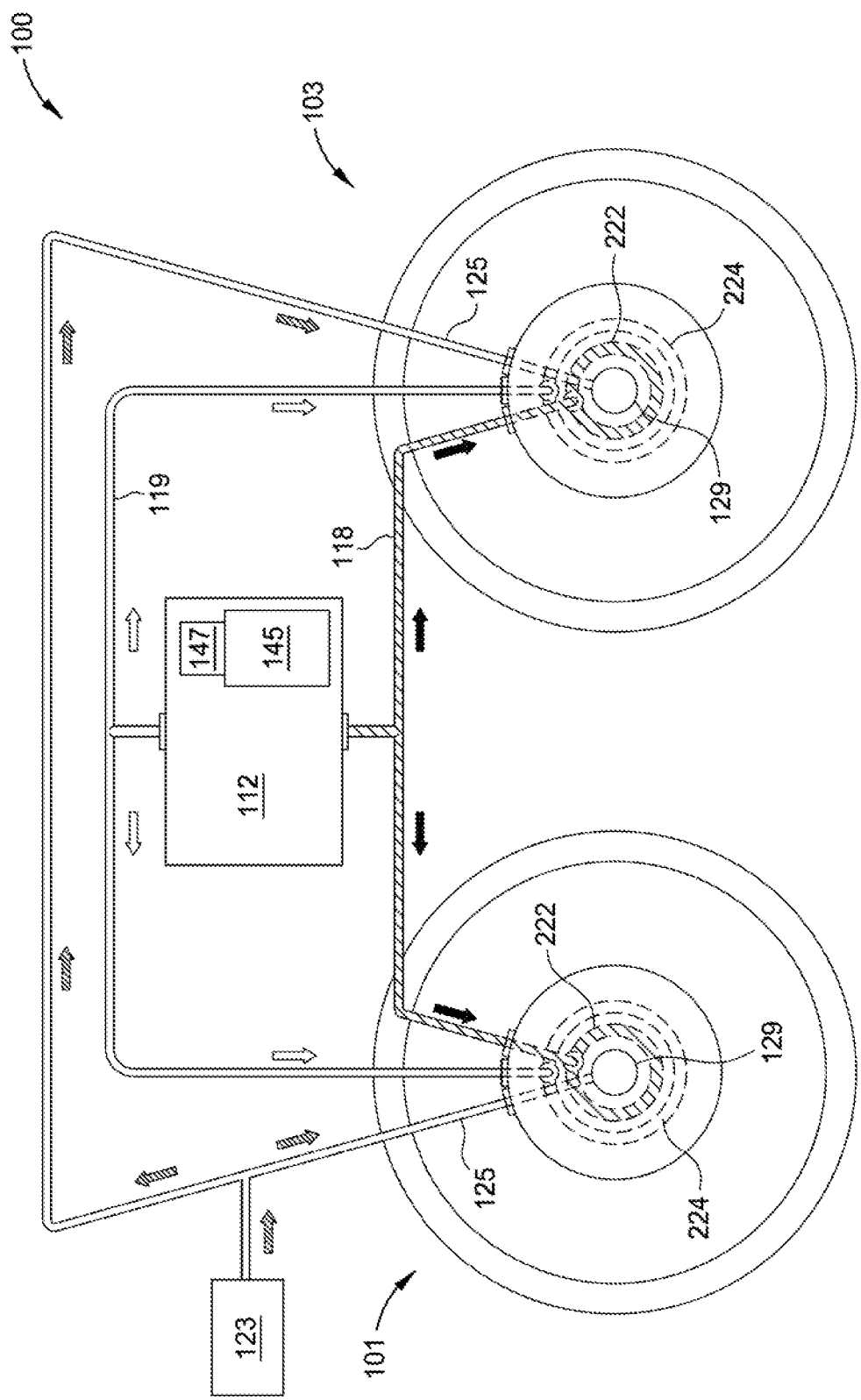
FIG. 1 depicts a top view of an exemplary tandem processing system according to embodiments of the present disclosure.

FIG. 1 depicts a top view of an exemplary tandem processing system 100 according to embodiments of the present disclosure. The processing system 100 includes two separate and adjacent processing chambers 101, 103 for processing the substrates. The processing chambers 101, 103 can share a first gas source 112 disposed adjacent to the processing chambers 101, 103. The first gas source 112 is coupled to the processing chambers 101, 103 through a first gas line 118 and a second gas line 119, respectively. The exemplary tandem processing system 100 may be incorporated into a processing system, such as a Producer™ processing system, commercially available from Applied Materials, Inc., of Santa Clara, Calif. It is to be understood that the disclosure also has utility in processing systems manufactured by other manufacturers.

The first gas source 112 may include a vaporizer 145 for vaporizing liquid precursor, such as tetraethoxysilane (TEOS). At least one heater 147 is coupled to the vaporizer 145 and heats the liquid precursor into a gas phase. The precursor gas is delivered to the first gas line 118 and/or the second gas line 119 and then to the processing chambers 101, 103. The first gas source 112 may contain one or more precursor sources, depending on the application. In some embodiments, the first gas source 112 may contain a source for a first gas mixture and a source for a second gas mixture. The first gas mixture may flow through the first gas line 118 and the second gas mixture may flow through the second gas line 119.

The first gas mixture and the second gas mixture may be suitable for depositing a dielectric material, such as silicon oxides. In one embodiment, the first gas mixture includes an oxygen-containing gas, a silicon-containing gas, and a carrier gas, while the second gas mixture includes the oxygen-containing gas and the carrier gas, or vice versa. Suitable oxygen-containing gas may include oxygen ($O_2$), ozone ($O_3$), carbon dioxide ($CO_2$), carbon monoxide (CO), nitrous oxide ($N_2O$), nitrous oxide ($N_2O$), nitric oxide (NO), or any combination thereof. Suitable silicon-containing gas may include silanes, halogenated silanes, organosilanes, and any combinations thereof. Silanes may include silane ($SiH_4$), tetraethoxysilane (TEOS), and higher silanes with the empirical formula $Si_xH_{(2x+2)}$, such as disilane ($Si_2H_6$), trisilane ($Si_3H_8$), and tetrasilane ($Si_4H_{10}$), or other higher order silanes such as polychlorosilane. Suitable carrier gases include argon, nitrogen, hydrogen, helium, or other suitable inert gases. Carrier gas may be used for carrying vaporized silicon-containing gas, such as TEOS.

In some embodiments, a second gas source 123 may be coupled to, through a third gas line 125, a central gas channel 129 of the processing chambers 101, 103. The central gas channel 129 is in fluid communication with the substrate processing region 108 (FIG. 2) of the processing chambers 101, 103. The second gas source 123 may include any suitable process precursor, such as the silicon-containing gas discussed above. Likewise, the second gas source 123 may include a vaporizer (not shown) and a heater (not shown) for vaporizing liquid precursor, such as TEOS. In an embodiment, the second gas source 123 includes a source of a third gas mixture containing silanes, such as TEOS.

In various embodiments to be discussed below, the first gas mixture and the second gas mixture may be routed to the inner gas zone 120 and outer gas zone 142 of the substrate processing region 108, respectively. The third gas mixture may be provided to the central gas channel 129. The third gas mixture, the first gas mixture and the second gas mixture are excited to form a plasma using capacitive or inductive means. These gas mixtures are decomposed in the plasma to deposit a layer of oxide, e.g., silicon oxide, on the surface of a substrate located in the processing chambers 101, 103.

Figure 2:
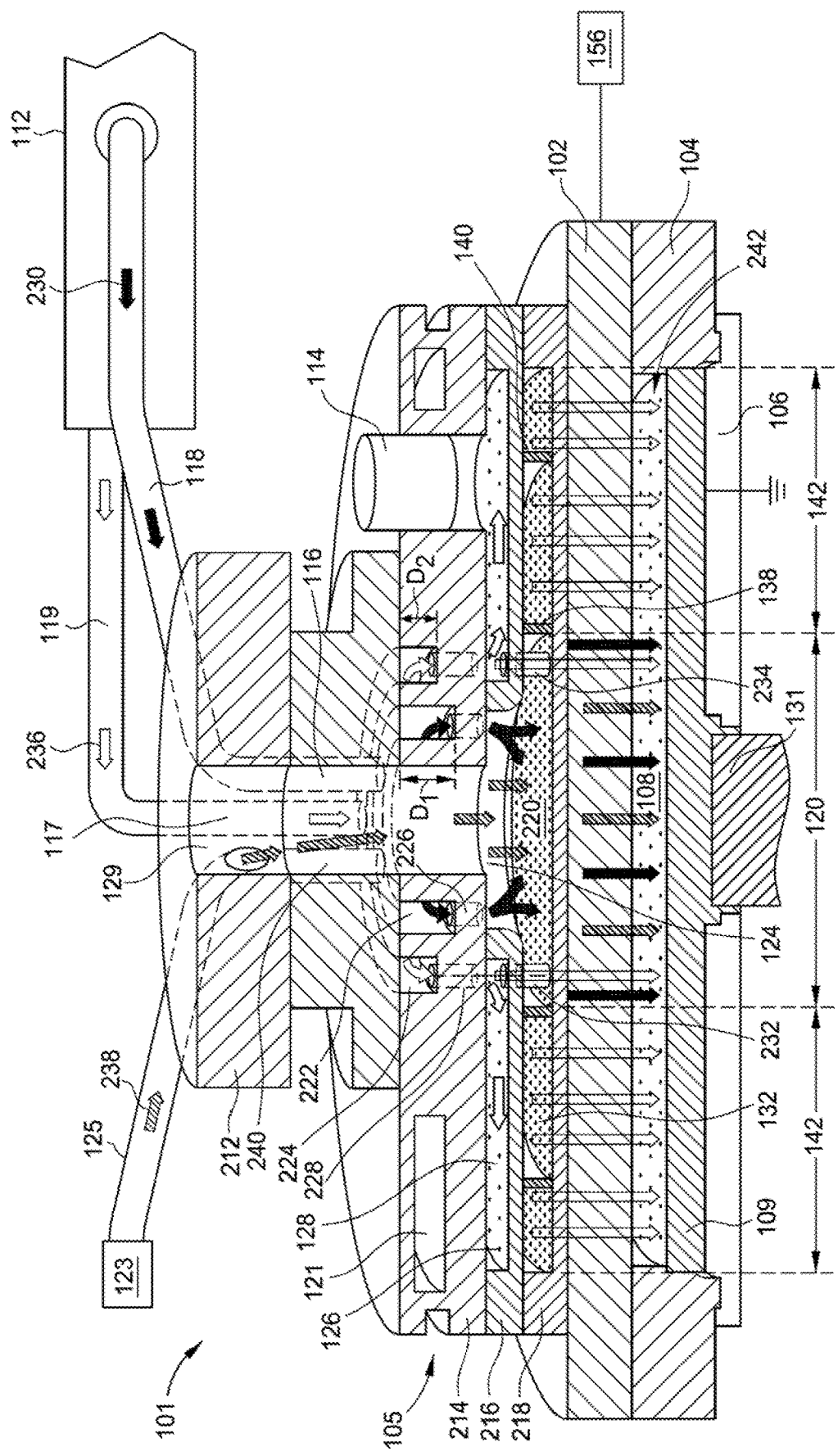
FIG. 2 depicts a cross-sectional view of a processing chamber of the tandem processing system according to embodiments of the present disclosure.

FIG. 2 depicts a cross-sectional view of the processing chamber 101 according to embodiments of the present disclosure. It should be understood that while only a portion of the processing system 100, e.g., the processing chamber 101, is shown, the description for the processing chamber 101 is equally applicable to the processing chamber 103 since the configuration of the processing chambers 101, 103 are substantially identical. Therefore, the operation and processing occurred in the processing chamber 101 can similarly and concurrently be performed in the processing chamber 103. The processing chamber 101 has a perforated lid 102, a gas blocker 105 disposed on the perforated lid 102, a chamber wall 104, and a bottom 106. The perforated lid 102, the chamber wall 104 and the bottom define the substrate processing region 108 where a substrate (not shown) is to be disposed. The substrate processing region 108 can be accessed through a port (not shown) in the chamber wall 104 that facilitates movement of the substrate into and out of the processing chamber 101.

A substrate support 109 is disposed within the processing chamber 101 and surrounded by the chamber wall 104. The substrate supporting surface of the substrate support 109 may have a plurality of holes 242 distributed evenly across the substrate supporting surface. The holes 242 are adapted to permit the flow of gases through the substrate supporting surface for cooling or heating of the substrate disposed thereon. The substrate support 109 may couple to a stem 131 that extends through the bottom 106 of the processing chamber 101. The stem 131 can be operated by a drive system (not shown) to move the substrate support 109 up and down, thereby changing the position of the substrate in the substrate processing region 108. The drive system can also rotate and/or translate the substrate support 109 during processing. The substrate support 109 and the substrate processing region 108 are configured to accommodate substrate having a nominal diameter size up to 12 inch (300 mm), 18 inch (450 mm), or other diameter.

The perforated lid 102 is supported by the chamber walls 104 and can be removed to service the interior of the processing chamber 101. The perforated lid 102 is generally comprised of aluminum, aluminum oxide, aluminum nitride, stainless steel, or any other suitable material. The gas blocker 105 disposed on the perforated lid 102 is a dual zone gas blocker configured to independently control the flow of two or more gas mixtures into the substrate processing region 108. The gas blocker 105 is in fluid communication with the first gas source 112 and the second gas source 123. In an example as shown, the first gas source 112 is connected to the gas blocker 105 through the first gas line 118 and the second gas line 119, respectively. The first gas line 118 may be connected to the first gas source 112 to provide the first gas mixture, e.g., the silicon-containing gas, the oxygen-containing gas, and the carrier gas, into the processing chamber 101. The second gas line 119 may be connected to the first gas source 112 to provide the second gas mixture, e.g., oxygen-containing gas and the carrier gas, into the processing chamber 101. The first gas line 118 may be heated and actively controlled to ensure that gas (e.g., TEOS) remains in the gas phase while traveling with the carrier gas to the processing chamber 101.

The gas blocker 105 generally includes a gas manifold 212, a first gas distribution plate 214 disposed below the gas manifold 212, a second gas distribution plate 216 disposed below the first gas distribution plate 214, and a third gas distribution plate 218 disposed below the second gas distribution plate 216. The central gas channel 129 is formed through at least the gas manifold 212 and the first gas distribution plate 214. The gas manifold 212, the first gas distribution plate 214, the second gas distribution plate 216, and the third gas distribution plate 218 are concentrically disposed about a central axis passing through the longitudinal axis of the central gas channel 129. The first gas distribution plate 214 may include one or more heat transfer fluid channels 121. The heat transfer fluid channels 121 can be used for regulating the temperature of the gas blocker 105 and/or the perforated lid 102 by flowing heat transfer fluid therethrough. Suitable heat transfer fluid may include, but is not limited to, water, air, helium, etc. The first gas distribution plate 214 may also include a pumping plenum 114 that fluidly connects the substrate processing region 108 to an exhaust port (that includes various pumping components, not shown).

The second gas distribution plate 216 has a central opening 124, and a recess region 128 formed in the top surface of the second gas distribution plate 216. The recess region 128 surrounds the central opening 124 and extends radially between the central opening 124 and the edge of the second gas distribution plate 216. The bottom of the first gas distribution plate 214 and the bottom of the second gas distribution plate 216 define a plenum for the recess region 128. The central opening 124 is in fluid communication with the central gas channel 129. In an embodiment, the central opening 124 has a diameter greater than the diameter of the central gas channel 129. The second gas distribution plate 216 has a plurality of through holes 126 formed through the bottom of the second gas distribution plate 216. The through holes 126 may be arranged in any suitable pattern. In one embodiment, the through holes 126 are arranged in multiple concentric rings of increasing diameter.

The third gas distribution plate 218 has a recess region 220 formed in the top surface of the third gas distribution plate 218. The bottom of the third gas distribution plate 218 contacts a top surface of the perforated lid 102. The bottom of the second gas distribution plate 216 and the bottom of the third gas distribution plate 218 define a plenum for the recess region 220. An inner ring 138 and an outer ring 140 are concentrically disposed on the bottom of the third gas distribution plate 216 between the second gas distribution plate 216 and the third gas distribution plate 218. The outer ring 140 surrounds the inner ring 138. The inner ring 138 and the outer ring 140 may be fabricated from aluminum, aluminum oxide, aluminum nitride, stainless steel, or other suitable material such as dielectric material. The inner ring 138 and the outer ring 140 can separate the recess region 220 into an inner gas zone 120 and an outer gas zone 142. For example, the region radially inward of the inner ring 138 can be defined as the inner gas zone 120. The region between the inner ring 138 and the outer ring 140 and the region radially outward of the outer ring 140 can be collectively defined as the outer gas zone 142. In cases where the third gas distribution plate has a diameter of about 360 mm, the inner gas zone 120 may start at a radial distance of about 20 mm or greater, for example about 30 mm to about 60 mm. The outer gas zone 142 may start at a radial distance of about 60 mm or greater, for example about 75 mm to 110 mm, measuring from the center of the third gas distribution plate 218.

The third gas distribution plate 218 has a plurality of through holes 132 formed through the bottom of the third gas distribution plate 218. The through holes 132 of the third gas distribution plate 218 may have a density greater than the density of the through holes 126 of the second gas distribution plate 216. In an example, the ratio of the density of the through holes 132 to the density of the through holes 126 can be in a range of about 1.5:1 to about 5:1, for example about 2:1 to about 3:1. The through holes 132 may be arranged in a radial pattern across the diameter of the third gas distribution plate 218 to allow uniform delivery of the gas into the substrate processing region 108.

The gas blocker 105 also includes a first gas channel 116 and a second gas channel 117. The first gas channel 116 and the second gas channel 117 are disposed to extend through at least a portion of the gas manifold 212. The first gas channel 116 is disposed radially outward of the central gas channel 129, and the second gas channel 117 is disposed radially outward of the first gas channel 116. The first gas channel 116 has a first end connected to, or in fluid communication with, the first gas line 118, and a second end connected to, or in fluid communication with, an inner trench 222 formed in the top surface of the first gas distribution plate 214. Similarly, the second gas channel 117 has a first end connected to, or in fluid communication with, the second gas line 119, and a second end connected to, or in fluid communication with, an outer trench 224 formed in the top surface of the first gas distribution plate 214. The inner trench 222 and the outer trench 224 are arranged in two concentric circles surrounding the central gas channel 129. The first gas channel 116 may be disposed at any location along the inner trench 222, and the second gas channel 117 may be disposed at any location along the outer trench 224. The inner trench 222 has a first depth D1 measuring from the top surface of the first gas distribution plate 214. The outer trench 224 has a second depth D2 measuring from the top surface of the first gas distribution plate 214. The first depth D1 may be shorter or greater than the second depth D2. In an example as shown, the first depth D1 is greater than the second depth D2. In an example, the ratio of the first depth D1 to the second depth D2 is about 1.1:1 to about 1.5:1, for example about 1.3:1.

In some embodiments, the gas blocker 105 may include a third gas channel 240 disposed through at least a portion of the gas manifold 212. The third gas channel 240 may be in fluid communication with the first and second gas sources 112, 123, or any other gas source containing any suitable gas source (e.g., nitrogen-containing gas source, or a dopant-containing gas source etc.) needed for the application. Likewise, the third gas channel 240 may be disposed radially outward of the central gas channel 129, and the third gas channel 240 may be disposed at any location along the inner trench 222 so that the third gas channel 240 and the inner trench 222 are in fluid communication with each other.

The inner trench 222 is in fluid communication with the inner gas zone 120 through one or more inner gas channels 226 also formed in the first gas distribution plate 214. The placement of the inner ring 138 confines the gas mixture (e.g., first gas mixture) flowing from the first gas channel 116 to the inner gas zone 120. The first gas mixture is then flowed through the perforated lid 102 and to the inner region of the substrate processing region 108. The inner region of the substrate processing region 108 (and thus the substrate disposed on the substrate support 109) substantially corresponds to the inner gas zone 120. The arrow 230 illustrates a possible flow path of the gas mixture from the first gas line 118 to the substrate processing region 108. Likewise, the outer trench 224 is in fluid communication with the recess region 128 of the second gas distribution plate 216 through one or more outer gas channels 228 also formed in the first gas distribution plate 214. The placement of the outer ring 140 confines the gas mixture (e.g., second gas mixture) flowing from the second gas channel 117 to the recess region 128 and into the outer gas zone 142. The second gas mixture is then flowed through perforated lid 102 and to the outer region of the substrate processing region 108. The outer region of the substrate processing region 108 (and thus the substrate disposed on the substrate support 109) substantially corresponds to the outer gas zone 142. While not shown, it should be understood that the perforated lid 102 has through holes corresponding to the through holes 132 of the third gas distribution plate 218. The arrow 236 illustrates a possible flow path of the gas mixture from the second gas line 119 to the substrate processing region 108. The arrow 238 illustrates a possible flow path of the gas mixture from the third gas line 125 to the substrate processing region 108.

In some embodiments, the gas blocker 105 may include a plurality of pass-through channels (e.g., pass-through channels 232, 234) disposed between the second gas distribution plate 216 and the third gas distribution plate 218. Each pass-through channel is configured to directly route the gas mixture (e.g., second gas mixture) from the recess region 128 of the second gas distribution plate 216 into the substrate processing region 108. The pass-through channels may be disposed radially inward of the inner ring 138. The pass-through channels may be provided in any number. For example, four pass-through channels (only two pass-through channels 232, 234 are shown for clarity) may be provided and angularly separated from each other by 90 degrees. The pass-through channels 232, 234 may form through the bottom of the second gas distribution plate 216 and extend into the bottom of the third gas distribution plate 218 and into the perforated lid 102. In some embodiments, the pass-through channels may extend through the entire thickness of the perforated lid 102. The pass-through channels 232, 234 allow the gas mixture (e.g., second gas mixture) to pass through the recess region 220 without being mixed prematurely with the gas mixture (e.g., first gas mixture) flowing from the first gas channel 116 and/or the gas mixture flowing through the central gas channel 129.

The perforated lid 102 and the substrate support 109 may serve as upper and bottom electrodes, respectively, for exciting and ionizing the gas mixtures in the substrate processing region 108. A bias power may be applied to the substrate support 109. The substrate support 109 may be grounded such that the perforated lid 102 supplied with an RF power (provided by a power source 156) may serve as a cathode electrode, while the grounded substrate support 108 may serve as an anode electrode. The perforated lid 102 and the substrate support 109 are operated to form an RF electric field in the substrate processing region 108. The RF electric field can ionize the gas mixtures into a plasma. If desired, any one or more of the first, second and third gas distribution plates 214, 216, 218 may serve as an electrode and operate to excite and ionize the gas mixtures in the recess region 128, 220. The RF power, generally having a frequency of between a few Hz to 13 MHz or higher, is provided in a wattage suitable for the substrate surface area. In one embodiment, the power source 156 includes a dual frequency source that provides a low frequency power at less than about 2 MHz (preferably about 200 to 500 kHz) and a high frequency power at greater than 13 MHz (preferably about 13.56 MHz). The frequencies may be fixed or variable. Illustratively, for a 300 mm substrate, the low frequency power may be about 0.3 to about 2 kW while the high frequency power may be about 1 to about 5 kW.

Figure 3:
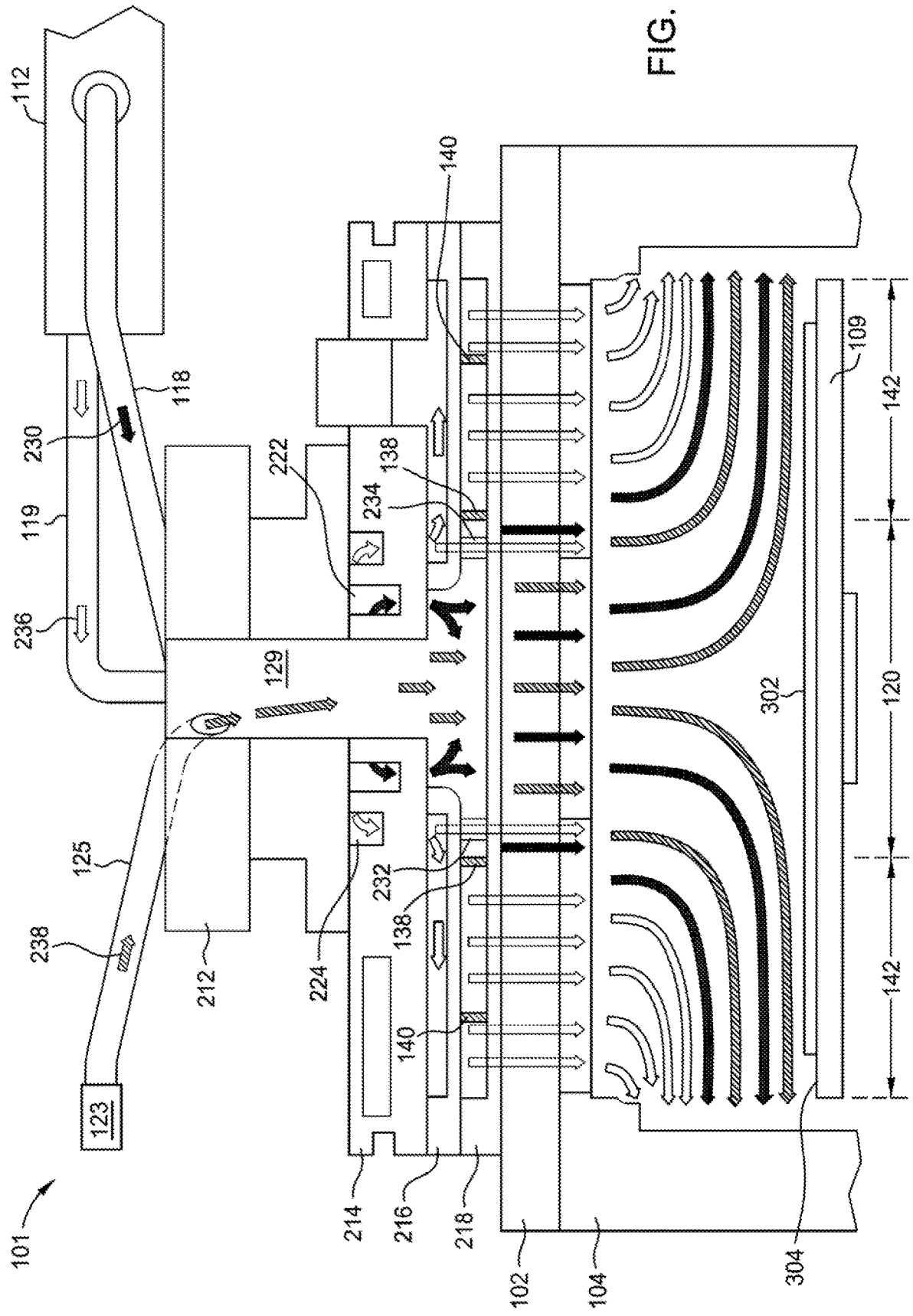
FIG. 3 illustrates exemplary flow path of the gas flow of gas mixtures according to embodiments of the present disclosure.

FIG. 3 depicts a simplified cross-sectional view of the processing chamber 101 of FIG. 2 having a substrate 302 disposed on the substrate support 109. FIG. 3 shows exemplary flow paths of the first, second, and third gas mixtures (represented by arrows 230, 236, 238, respectively) from the first and second gas sources 112, 123 to the substrate processing region 108 according to embodiments of the present disclosure. As can be seen, the placement of the inner ring 138 and the outer ring 140 can restrict all or the majority of the first gas mixture 230 from the first gas line 118 and the third gas mixture 238 from the third gas line 125 to the inner gas zone 120, and restrict all or the majority of the second mixture gas 236 from the second gas line 119 to the outer gas zone 142. Therefore, the first and third gas mixtures 230, 238 from the first gas line 118 and third gas line 125, such as TEOS, $O_2$ and argon, will pass the through holes of the third gas distribution plate 218 located within the inner ring 138, and flow downwardly through the perforated lid 102 toward the inner region of the substrate processing region 108. As the first and third gas mixtures 230, 238 approach the substrate support 109, the flows curve into radial outward flows along the top surface 304 of the substrate support 109. The radial outward flows of the first and third gas mixtures 230, 238 continue to the outer region of the substrate processing region 108, maintaining flows of the first and third gas mixtures 230, 238 from the inner region of the substrate processing region 108 to its perimeter. In the meantime, the second gas mixture 236 from the second gas line 119, such as oxygen and argon gases, will pass the through holes of the second and third gas distribution plates 216, 218, and flow downwardly through the perforated lid 102 toward the outer region of the substrate processing region 108. Particularly, as the second gas mixture 236 approaches the radial outward flows of the first and third gas mixtures 230, 238, the flow of the second gas mixture 236 curves into a radial outward flow and flows with the radial outward flows of the first and third gas mixtures 230, 238 toward the edge of the substrate processing region 108. The first, second, and third gas mixtures 230, 236, 238 are ionized and form a plasma while flowing into the substrate processing region 108 for deposition of a layer, such as silicon oxide, on the substrate disposed on the substrate support 109 in an uniform manner.

It has been observed that inefficient TEOS concentration can occur near the edge of the substrate support 109 (and thus the substrate disposed thereon) due to the presence of surface boundary layer, which may result in varying plasma densities across the surface of the substrate and cause different deposition rates between the center and the edge of the substrate. The configuration of the gas blocker 105 offers many advantages as it can restrict the flow of TEOS to the inner region of the substrate processing region 108 while allowing a dedicate flow of the oxygen and argon gases (e.g., second gas mixture 236) to the outer region of the substrate processing region 108. The addition of oxygen and argon gas (e.g., second gas mixture 236) to the outer region of the substrate processing region 108 can confine the flow of TEOS, O$_2$ and Ar (e.g., first and third gas mixtures 230, 238) within the inner region of the substrate processing region 108 and maintain the residence time of TEOS within the inner region of the substrate processing region 108. The addition of oxygen and argon gas to the outer region of the substrate processing region 108 can also promote gas reaction at or near the edge of the substrate support 105, thereby enhancing the TEOS concentration near the edge of the substrate. Since the TEOS concentration at the edge of the substrate is increased, the plasma density at the substrate edge during processing can be increased accordingly. As a result, a uniform deposition rate between the center and the edge of the substrate can be obtained.

Moreover, it has been observed that the arrangement of the inner ring 138 and the outer ring 140 can be used to adjust the film deposition rate (and thus the film profile across the substrate surface). For example, the outer peripheral surface of the inner ring 138 may be disposed at a radial distance of about 75 mm, for example about 80 mm to 90 mm, measuring from the center of the substrate 110, to provide gas split of about 27% of the total gas flow at the inner gas zone 120 and about 73% of the total gas flow at the outer gas zone 142. The term total gas flow described herein refers to total flow of the gas mixtures present in the recess region 220. This arrangement can yield good deposition uniformity across the substrate surface.

Furthermore, it has been observed that varying about 2-4% of TEOS flow (negligible amount of flow in the total process flow) in the inner region of the substrate processing region 108 can result in about 5-10% change in deposition rates and film profile without affecting film properties. For example, a 2% increase of TEOS flow in the inner region of the substrate processing region 108 can result in a 2.6% increase in deposition rate on the inner region of the substrate. A 4% increase of TEOS flow in the inner region of the substrate processing region 108 can result in a 5.5% increase in deposition rate on the inner region of the substrate. In addition, a 2% decrease of TEOS flow in the inner region of the substrate processing region 108 can result in a 2.0% decrease in deposition rate on the inner region of the substrate. A 4% decrease of TEOS flow in the inner region of the substrate processing region 108 can result in a 4.2% decrease in deposition rate on the inner region of the substrate.

Likewise, it has been observed that varying about 2-4% of TEOS flow (negligible amount of flow in the total process flow rate) in the outer region of the substrate processing region 108 can result in about 1-2% change in deposition rates and film profile without affecting film properties. For example, a 2% increase of TEOS flow in the outer region of the substrate processing region 108 can result in a 0.9% increase in deposition rate on the outer region of the substrate. A 4% increase of TEOS flow in the outer region of the substrate processing region 108 can result in a 1.5% increase in deposition rate on the outer region of the substrate. In addition, a 2% decrease of TEOS flow in the outer region of the substrate processing region 108 can result in a 0.1% increase in deposition rate on the outer region of the substrate. A 4% decrease of TEOS flow in the outer region of the substrate processing region 108 can result in a 0.6% decrease in deposition rate on the inner region of the substrate.

In either case above, the total process flow of the gas mixtures in the inner gas zone 120/outer gas zone 142 may be about 10,500 sccm and the total TEOS flow in the inner gas zone 120/outer gas zone 142 may be about 177 sccm to about 1650 mgm. Therefore, varying 2% of the TEOS flow is about 3.55 sccm to about 33 mgm (about 0.034% of total gas flow). By changing the flow rate of TEOS in the first and third gas mixtures (flowing to the inner region of the substrate processing region 108) and/or the flow rate of TEOS in the second gas mixture (flowing to the outer region of the substrate processing region 108), the deposition rates of the layer, e.g., oxides, can be adjusted to tune the edge profile of the deposited layer and/or the overall layer uniformity on the substrate.

While the foregoing is directed to embodiments of the present disclosure, other and further embodiments of the disclosure may be devised without departing from the basic scope thereof, and the scope thereof is determined by the claims that follow.

The invention claimed is:

1. A processing chamber for processing a substrate, comprising:
   a first gas source comprising a first gas line and a second gas line;
   a perforated lid;
   a gas blocker disposed on the perforated lid, the gas blocker comprising:
      a gas manifold;
      a central gas channel formed in the gas manifold;
      a first gas distribution plate disposed below the gas manifold, the first gas distribution plate comprising an inner trench surrounding the central gas channel and an outer trench surrounding the inner trench, the central gas channel extending through the first gas distribution plate, bypassing the inner trench and outer trench;
a first gas channel formed in the gas manifold, the first gas channel having a first end in fluid communication with the first gas line and a second end in fluid communication with the inner trench;
a second gas channel formed in the gas manifold, the second gas channel having a first end in fluid communication with the second gas line and a second end in fluid communication with the outer trench;
a second gas distribution plate disposed below the first gas distribution plate, the second gas distribution plate comprising a recess region comprising a ring shaped plenum in fluid communication with the outer trench, a central opening congruous with the central gas channel and bypassing the recess region, and a plurality of through holes formed through a bottom of the second gas distribution plate; and
a third gas distribution plate disposed below the second gas distribution plate, the third gas distribution plate comprising a plurality of through holes formed through a bottom of the third gas distribution plate, and the third gas distribution plate contacting a top surface of the perforated lid; and
a substrate support disposed below the perforated lid, the substrate support having a substrate supporting surface.

2. The processing chamber of claim 1, wherein the recess region is formed in a top surface of the second gas distribution plate, the recess region surrounding the central opening and extending radially between the central opening and an edge of the second gas distribution plate.

3. The processing chamber of claim 2, wherein the third gas distribution plate comprises:
a recess region formed in a top surface of the third gas distribution plate.

4. The processing chamber of claim 3, wherein the third gas distribution plate comprises:
an inner ring defining an inner gas zone of the third gas distribution plate, the inner gas zone being in fluid communication with the inner trench; and
an outer ring surrounding the inner ring, wherein the inner ring and the outer ring are concentrically disposed between the second gas distribution plate and the third gas distribution plate, and wherein the inner ring and the outer ring defines an outer gas zone of the third gas distribution plate, and the outer gas zone is in fluid communication with the recess region of the second distribution plate.

5. The processing chamber of claim 1, wherein the through holes of the third gas distribution plate have a first density and the through holes of the second gas distribution plate have a second density, and a ratio of the first density to the second density is in a range of about 1.5:1 to about 5:1.

6. The processing chamber of claim 1, wherein the inner trench has a first depth and the outer trench has a second depth, and a ratio of the first depth to the second depth is about 1.1:1 to about 1.5:1.

7. The processing chamber of claim 1, wherein the first gas source comprises:
a source of a first gas mixture comprising an oxygen-containing gas, a silicon-containing gas, and a carrier gas, wherein the source of the first gas mixture is in fluid communication with the first gas line; and
a source of a second gas mixture comprising an oxygen-containing gas and a carrier gas, wherein the source of the second gas mixture is in fluid communication with the second gas line.

8. The processing chamber of claim 7, further comprising:
a second gas source comprising a third gas line in fluid communication with the central gas channel, and the second gas source comprises a source of a third gas mixture comprising a silicon-containing gas and a carrier gas.

9. The processing chamber of claim 8, wherein the oxygen-containing gas comprises ($O_2$), ozone ($O_3$), carbon dioxide ($CO_2$), carbon monoxide (CO), nitrous oxide ($N_2O$), nitrous oxide ($N_2O$), nitric oxide (NO), or any combination thereof, and the silicon-containing gas comprises silane ($SiH_4$), tetraethoxysilane (TEOS), disilane ($Si_2H_6$), trisilane ($Si_3H_8$), tetrasilane ($Si_4H_{10}$), or any combination thereof.

10. The processing chamber of claim 1, wherein the central gas channel is formed through at least the gas manifold and the first gas distribution plate, the first gas channel is disposed radially outward of the central gas channel, and the second gas channel is disposed radially outward of the first gas channel.

11. A processing chamber for processing a substrate, comprising:
a perforated lid;
a gas blocker disposed on the perforated lid, the gas blocker comprising:
a gas manifold;
a central gas channel formed in the gas manifold;
a first gas distribution plate disposed below the gas manifold, the first gas distribution plate comprising an inner trench surrounding the central gas channel and an outer trench surrounding the inner trench, the central gas channel extending through the first gas distribution plate, bypassing the inner trench and outer trench;
a first gas channel formed in the gas manifold, the first gas channel having a first end configured for fluid communication with a first gas line of a gas source and a second end in fluid communication with the inner trench;
a second gas channel formed in the gas manifold, the second gas channel having a first end configured for fluid communication with a second gas line of the gas source and a second end in fluid communication with the outer trench;
a second gas distribution plate disposed below the first gas distribution plate, the second gas distribution plate comprising a recess region comprising a ring shaped plenum in fluid communication with the outer trench, a central opening congruous with the central gas channel and bypassing the recess region, and a plurality of through holes formed through a bottom of the second gas distribution plate; and
a third gas distribution plate disposed below the second gas distribution plate, the third gas distribution plate comprising a plurality of through holes formed through a bottom of the third gas distribution plate, and the third gas distribution plate contacting a top surface of the perforated lid; and
a substrate support disposed below the perforated lid, the substrate support having a substrate supporting surface.

12. The processing chamber of claim 11, wherein the recess region is formed in a top surface of the second gas distribution plate, the recess region surrounding the central opening and extending radially between the central opening and an edge of the second gas distribution plate.

13. The processing chamber of claim 12, wherein the third gas distribution plate comprises:
   a recess region formed in a top surface of the third gas distribution plate.

14. The processing chamber of claim 13, wherein the third gas distribution plate comprises:
   an inner ring defining an inner gas zone of the third gas distribution plate, the inner gas zone being in fluid communication with the inner trench; and
   an outer ring surrounding the inner ring, wherein the inner ring and the outer ring are concentrically disposed between the second gas distribution plate and the third gas distribution plate, and wherein the inner ring and the outer ring defines an outer gas zone of the third gas distribution plate, and the outer gas zone is in fluid communication with the recess region of the second distribution plate.

15. The processing chamber of claim 11, wherein the through holes of the third gas distribution plate have a first density and the through holes of the second gas distribution plate have a second density, and a ratio of the first density to the second density is in a range of about 1.5:1 to about 5:1.

16. The processing chamber of claim 11, wherein the inner trench has a first depth and the outer trench has a second depth, and a ratio of the first depth to the second depth is about 1.1:1 to about 1.5:1.

17. The processing chamber of claim 11, wherein the central gas channel is formed through at least the gas manifold and the first gas distribution plate, the first gas channel is disposed radially outward of the central gas channel, and the second gas channel is disposed radially outward of the first gas channel.

* * * * *